United States Patent
Shan et al.

(10) Patent No.: US 12,125,726 B2
(45) Date of Patent: Oct. 22, 2024

(54) MASK POD AND SEMICONDUCTOR DEVICE

(71) Applicant: CHANGXIN MEMORY TECHNOLOGIES, INC., Hefei (CN)

(72) Inventors: Chuang Shan, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 103 days.

(21) Appl. No.: 17/657,799

(22) Filed: Apr. 4, 2022

(65) Prior Publication Data

US 2023/0020975 A1 Jan. 19, 2023

Related U.S. Application Data

(63) Continuation of application No. PCT/CN2021/117416, filed on Sep. 9, 2021.

(30) Foreign Application Priority Data

Jul. 19, 2021 (CN) .......................... 202110813124.1

(51) Int. Cl.
*H01L 21/673* (2006.01)

(52) U.S. Cl.
CPC .. *H01L 21/67359* (2013.01); *H01L 21/67376* (2013.01); *H01L 21/67386* (2013.01); *H01L 21/67393* (2013.01)

(58) Field of Classification Search
CPC ......... H01L 21/67359; H01L 21/67376; H01L 21/67772

USPC ........................................................ 206/454
See application file for complete search history.

(56) References Cited

U.S. PATENT DOCUMENTS

| 5,988,392 A | * | 11/1999 | Hosoi | ............... | H01L 21/67373 206/711 |
| 6,010,008 A | * | 1/2000 | Nyseth | ............... | H01L 21/67383 206/711 |
| 6,105,782 A | * | 8/2000 | Fujimori | ........... | H01L 21/67373 206/710 |
| 6,540,467 B1 | * | 4/2003 | Zohni | ............... | H01L 21/67369 414/940 |

(Continued)

FOREIGN PATENT DOCUMENTS

| CN | 1486388 A | 3/2004 |
| CN | 1689928 | 11/2005 |

(Continued)

OTHER PUBLICATIONS

International Search Report cited in PCT/CN2021/117416 mailed Apr. 20, 2022, 9 pages.

*Primary Examiner* — J. Gregory Pickett
*Assistant Examiner* — Jenine Pagan
(74) *Attorney, Agent, or Firm* — Syncoda LLC; Feng Ma

(57) ABSTRACT

The present disclosure relates to the technical field of semiconductors, and provides a mask pod and a semiconductor device. The mask pod includes: a body, wherein the body has an accommodation space configured to accommodate a mask, the accommodation space has a first opening, and the first opening is located on a circumferential side of the body; and a shielding member, wherein the shielding member is provided on the body and is movably provided relative to the body, to shield or release the first opening.

11 Claims, 7 Drawing Sheets

(56) References Cited

U.S. PATENT DOCUMENTS

| | | | |
|---|---|---|---|
| 6,622,883 B1* | 9/2003 | Wu | H01L 21/67373 |
| | | | 220/323 |
| 6,623,051 B2 | 9/2003 | Bonora | |
| 7,735,648 B2 | 6/2010 | Rival et al. | |
| 8,336,838 B2* | 12/2012 | Tsai | G11B 33/123 |
| | | | 248/220.21 |
| 9,152,189 B2* | 10/2015 | Fan | G06F 1/187 |
| 2003/0107187 A1* | 6/2003 | Yajima | F16J 15/104 |
| | | | 277/628 |
| 2008/0035237 A1* | 2/2008 | Pan | H01L 21/67393 |
| | | | 141/98 |
| 2009/0245978 A1 | 10/2009 | Okabe | |
| 2013/0248413 A1 | 9/2013 | Ku et al. | |

FOREIGN PATENT DOCUMENTS

| | | |
|---|---|---|
| CN | 204161792 U | 2/2015 |
| CN | 111352296 | 6/2020 |
| JP | H1165094 A | 3/1999 |
| TW | M588104 U | 12/2019 |

\* cited by examiner (a)

(b)

MASK POD AND SEMICONDUCTOR DEVICE

CROSS-REFERENCE TO RELATED APPLICATIONS

This is a continuation of International Application No. PCT/CN2021/117416, filed on Sep. 9, 2021, which claims the priority to Chinese Patent Application 202110813124.1, titled "MASK POD AND SEMICONDUCTOR DEVICE" and filed on Jul. 19, 2021. The entire contents of International Application No. PCT/CN2021/117416 and Chinese Patent Application 202110813124.1 are incorporated herein by reference.

TECHNICAL FIELD

The present disclosure relates to the technical field of semiconductors, and in particular, to a mask pod and a semiconductor device.

BACKGROUND

A mask pod is configured to store a mask. In a process of using the mask, the mask pod needs to be placed on a corresponding machine platform to be opened to take out the mask.

In the related art, when a mask pod is opened, a pod cover and a body are separated up and down, and then the mask is clamped into the interior of the machine platform. Airflow disturbance occurs in an opening and closing process of the pod cover. Consequently, dust inside the machine platform falls on the mask, which affects a yield rate of a semiconductor structure.

SUMMARY

The present disclosure provides a mask pod and a semiconductor device, to improve use performance of the mask pod.

According to a first aspect of the present disclosure, a mask pod is provided, including:
a body, wherein the body has an accommodation space configured to accommodate a mask, the accommodation space has a first opening, and the first opening is located on a circumferential side of the body; and
a shielding member, wherein the shielding member is provided on the body and is movably provided relative to the body, to shield or release the first opening.

According to a second aspect of the present disclosure, a semiconductor device is provided, including the foregoing mask pod.

BRIEF DESCRIPTION OF THE DRAWINGS

The preferred implementations of the present disclosure are described in detail below with reference to the accompanying drawings to make the objectives, features and advantages of the present disclosure more obvious. The accompanying drawings are merely exemplary illustrations of the present disclosure, and are not necessarily drawn to scale. The same reference numerals in the accompanying drawings always represent the same parts. In the drawings.

DETAILED DESCRIPTION

Figure 1:
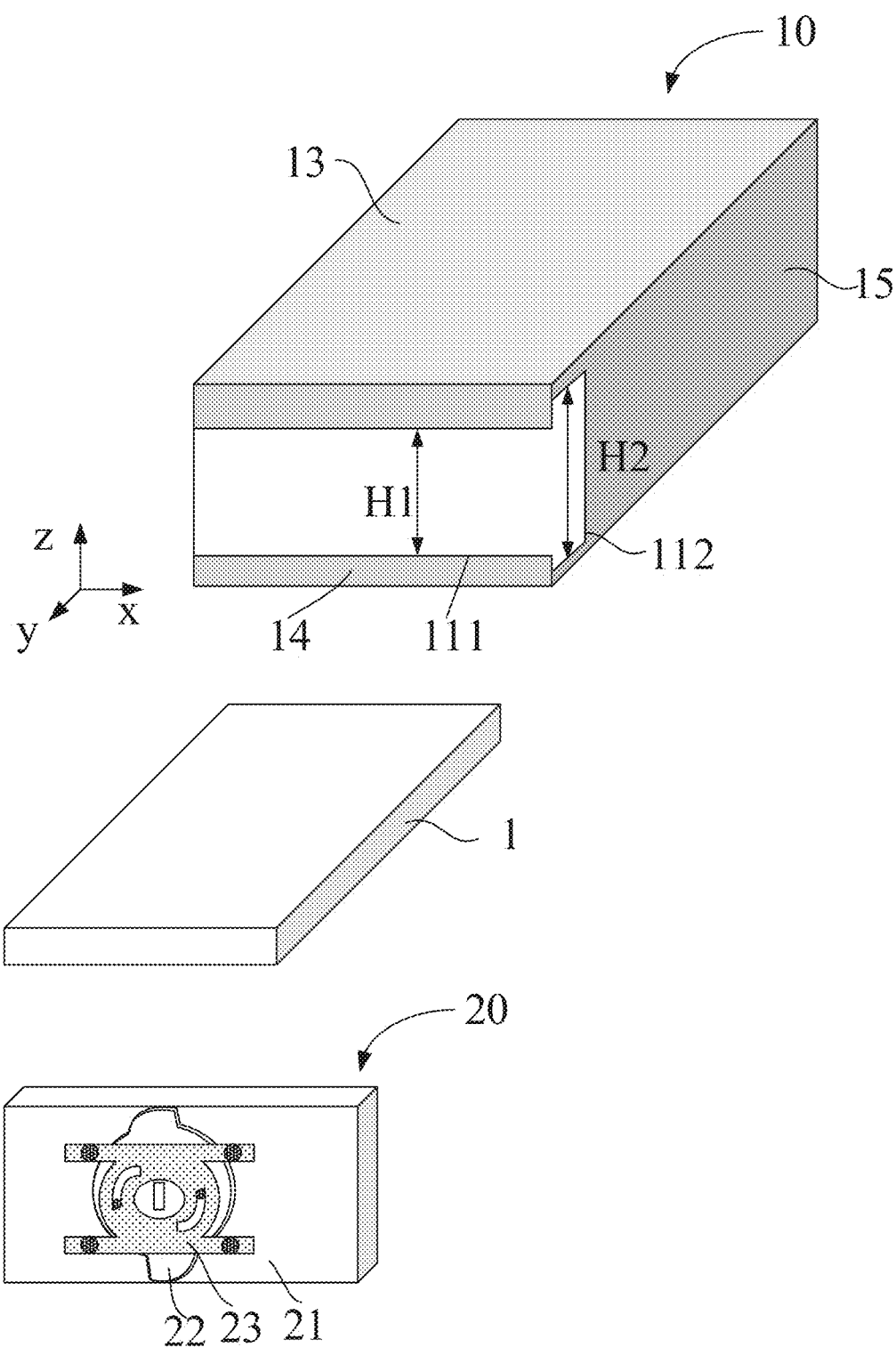
FIG. 1 is a schematic diagram of an exploded structure of a mask pod according to an exemplary implementation.

The typical embodiments embodying the features and advantages of the present disclosure are described in detail below. It should be understood that the present disclosure may have various changes in different embodiments, which do not depart from the scope of the present disclosure. The description and accompanying drawings herein are essentially used for the purpose of explanation, rather than limiting the present disclosure.

Different exemplary implementations of the present disclosure are described below with reference to the accompanying drawings. The accompanying drawings form a part of the present disclosure, which show by way of example different exemplary structures, systems, and steps that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure.

An embodiment of the present disclosure provides a mask pod. Referring to FIG. 1 to FIG. 5, the mask pod includes: a body 10, where the body 10 has an accommodation space 11 configured to accommodate a mask 1, the accommodation space 11 has a first opening 111, and the first opening 111 is located on a circumferential side of the body 10; and a shielding member 20, where the shielding member 20 is provided on the body 10 and is movably provided relative to the body 10, to shield or release the first opening 111.

A mask pod in an embodiment of the present disclosure includes the body 10 and the shielding member 20, the mask 1 is stored in the accommodation space 11 of the body 10, and the mask 1 can be taken out from the accommodation space 11 through the first opening 111. Because the first opening 111 is located on the circumferential side of the body 10, when the shielding member 20 configured to shield or release the first opening 111 releases the first opening 111, the mask pod is separated front to back. This effectively avoids a phenomenon of airflow disturbance, reduces a phenomenon of dust contamination of the mask 1, and effectively improves a yield rate of a semiconductor structure.

It should be noted that, in the related art, the first opening is located on an upper surface or a lower surface of the body. When the mask 1 needs to be taken out, the mask pod is separated up and down, which causes dynamic airflow, causes dust to fall on the mask 1, and affects exposure. However, in this embodiment, because the first opening 111 of the mask pod is located on the circumferential side of the body 10, when the mask 1 needs to be taken out, the mask pod is separated front to back. This effectively avoids the phenomenon of airflow disturbance, and reduces the phenomenon of dust contamination of the mask 1.

The shielding member 20 is movably provided relative to the body 10. That is, a position of the shielding member 20 is changed, such that the shielding member 20 shields the first opening 111, and in this case, the mask 1 is sealed inside the body 10; when the shielding member 20 releases the first opening 111, the mask 1 is exposed through the first opening 111, and in this case, the mask 1 may be taken out from the body 10 through the first opening 111.

In some embodiments, the shielding member 20 may move relative to the body 10, but when the shielding member 20 releases the first opening 111, the shielding member 20 may not be removed from the body 10. In this case, a part of the shielding member 20 may be restrictively connected to the body 10. For example, one end of the shielding member 20 may be hinged to the body 10, and the shielding member 20 is rotated, such that the shielding member 20 shields or releases the first opening 111. Alternatively, the shielding member 20 may be pullably provided on the body 10, and after the body 10 is pulled into place, one end of the shielding member 20 may be in restricted contact with the body 10, to avoid the shielding member 20 from being detached from the body 10. In this case, a corporation manner of the shielding member 20 and the body 10 is similar to a drawer structure, where a difference lies in that when the shielding member 20 is pulled out, the first opening 111 of the body 10 needs to be released.

In an embodiment, the shielding member 20 is detachably connected to the body 10, that is, when the mask 1 needs to be taken out from the body 10, the shielding member 20 is detached, to completely release the first opening 111. The shielding member 20 may be detached along a direction far away from the first opening 111, that is, the shielding member 20 is detached along a direction perpendicular to the first opening 111. Alternatively, the shielding member 20 may be detached along a direction parallel to the first opening 111. This is not limited herein, provided that the shielding member 20 can be ensured to be detached.

Optionally, the shielding member 20 is connected to the body 10 by using a fastener member, that is, when the shielding member 20 needs to be detached from the body 10, the fastener member releases a connection relationship between the shielding member 20 and the body 10, to detach the shielding member 20 from the body 10.

Optionally, the shielding member 20 is clamped with the body 10. When the shielding member 20 needs to be detached from the body 10, a clamping relationship between the shielding member 20 and the body 10 may be released first, and then the shielding member 20 is detached from the body 10. Alternatively, an external force is applied to the shielding member 20, such that in a process of detaching the shielding member 20 from the body 10, the clamping relationship between the shielding member 20 and the body 10 is also released. For example, the shielding member 20 is provided with a deformable buckle, and the body 10 is provided with a slot, the buckle enters the slot through deformation, and when the detaching is performed, the buckle is detached from the slot through deformation.

In an embodiment, as shown in FIG. 2 to FIG. 6, the shielding member 20 includes: a cover body portion 21, where the cover body portion 21 shields or releases the first opening 111; and a clamping portion 22, where the clamping portion 22 is connected to the cover body portion 21 and is movably provided relative to the cover body portion 21, such that the clamping portion 22 has a first position clamped with the body 10 and a second position separated from the body 10, where when the clamping portion 22 is located at the second position, the shielding member 20 can be removed from the body 10. The cover body portion 21 may not have a fixed connection relationship with the body 10, but relies on the clamping portion 22 to implement clamping with the body 10. Therefore, a position of the clamping portion 22 may be adjusted, such that the shielding member 20 is connected to or is detached from the body 10.

Optionally, the clamping portion 22 may be a plug, and the body 10 is provided with a socket. The plug is slid to be inserted into the socket, or the plug is pulled out from the socket, such that the shielding member 20 is connected to the body 10, or the shielding member 20 is separated from the body 10.

Optionally, the clamping portion 22 is rotatably provided relative to the cover body portion 21, that is, the clamping portion 22 is rotated, such that the clamping portion 22 switches between the first position and the second position, thereby facilitating connection and separation between the shielding member 20 and the body 10.

Further, the body 10 is provided with a clamping slot 101, and when the clamping portion 22 is located at the first position, the clamping portion 22 is inserted into the clamping slot 101, or when the clamping portion 22 is located at the second position, the clamping portion 22 is detached from the clamping slot 101. The clamping portion 22 is rotated, such that the clamping portion 22 enters or is detached from the clamping slot 101, to facilitate connection and separation between the shielding member 20 and the body 10, which is not only easy to operate, but also has better stability of the connection.

Figure 2:
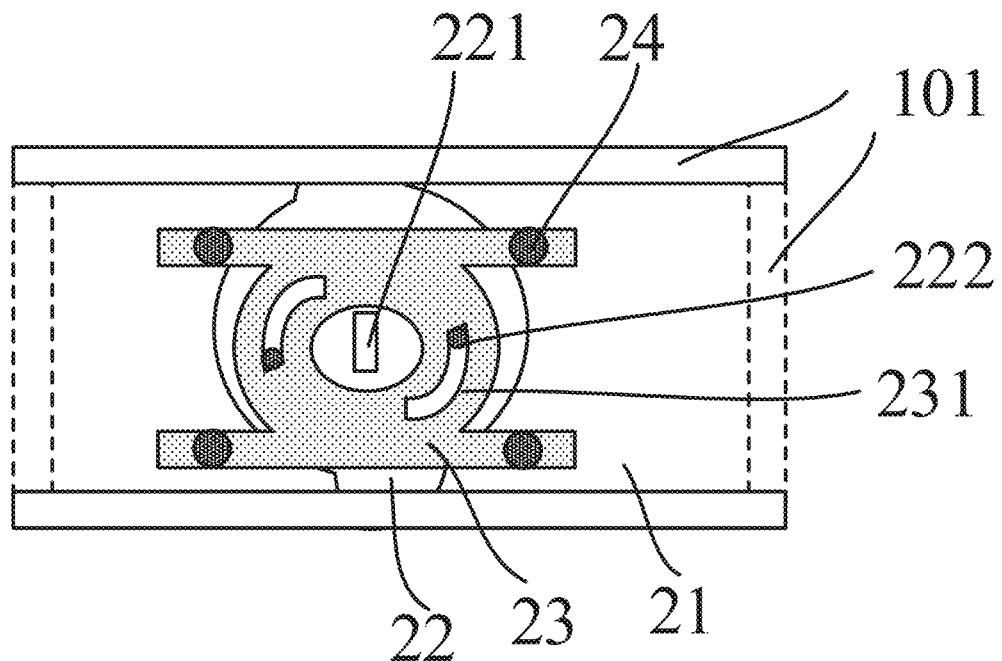
FIG. 2 is a schematic structural diagram of a mask pod from the first angle of view according to an exemplary implementation.

In an embodiment, as shown in FIG. 2, the clamping portion 22 is provided with a rotating slot 221, and/or the clamping portion 22 is provided with a rotating buckle 222. The rotating slot 221 and the rotating buckle 222 are configured to connect to an external component, such that the external component drives the clamping portion 22 to rotate relative to the cover body portion 21. The external component may be a robot 51, and the robot 51 herein includes a machine arm and a control portion.

Optionally, there may be both a plurality of rotating slots 221 and rotating buckles 222. The rotating buckle 222 may have a protrusion structure. A specific form of the protrusion structure is not limited herein and may be selected according to an actual requirement. Correspondingly, a specific form of the rotating slot 221 is also not limited herein and may be selected according to an actual requirement.

Figure 3:
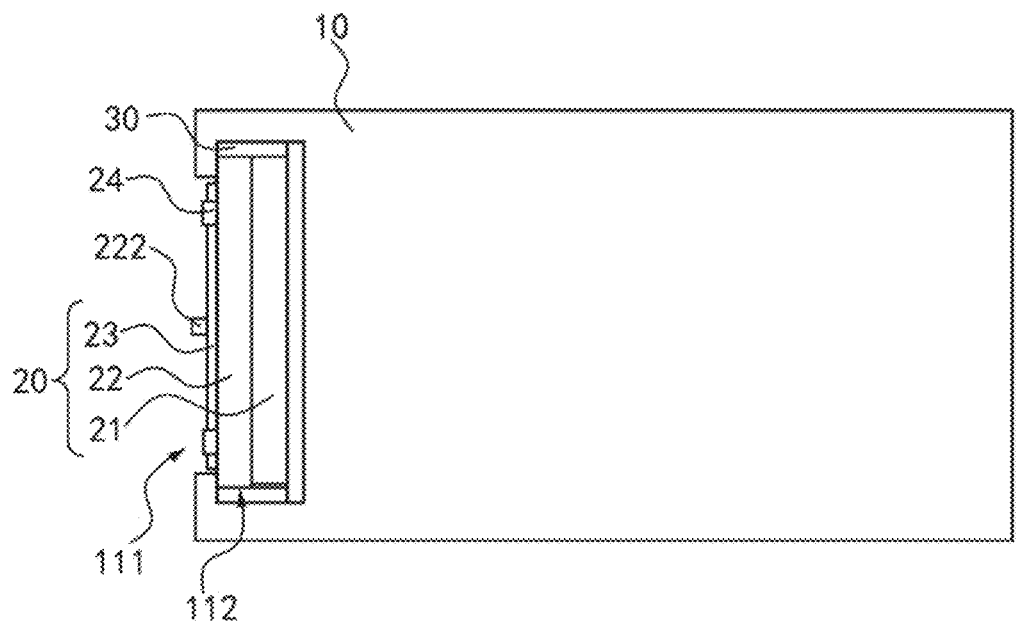
FIG. 3 is a schematic structural diagram of a mask pod from the second angle of view according to an exemplary implementation.
Figure 4:
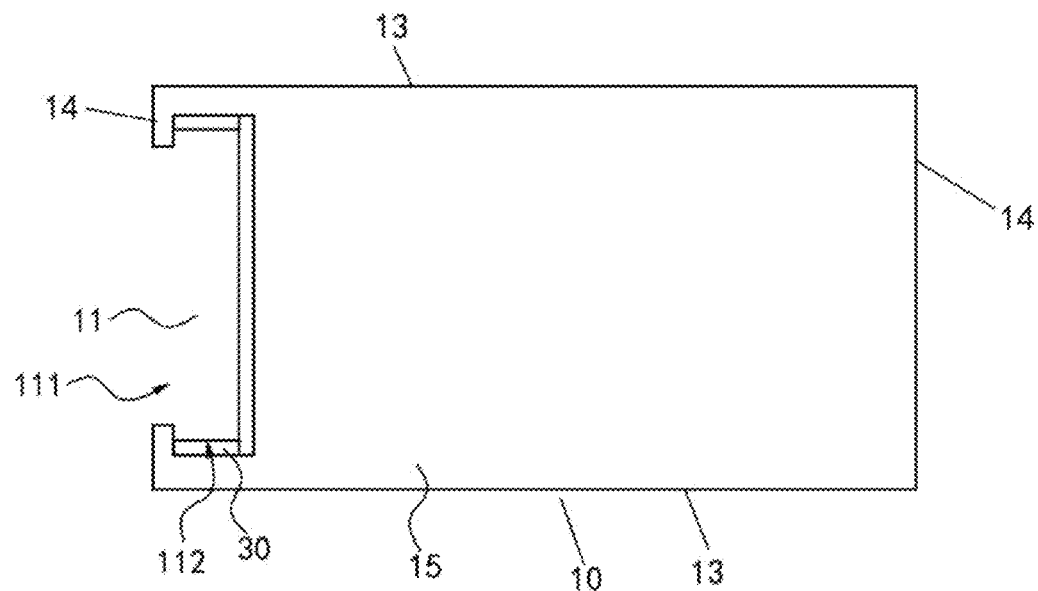
FIG. 4 is a schematic structural diagram of a body and a sealing member of a mask pod according to an exemplary implementation.

In an embodiment, as shown in FIG. 3 and FIG. 4, the accommodation space 11 has a second opening 112, the second opening 112 is located on a circumferential side of the body 10, the shielding member 20 is inserted into the accommodation space 11 through the second opening 112, or the shielding member 20 is taken out from the accommodation space 11 through the second opening 112. The mounting and detaching of the shielding member 20 relative to the body 10 is performed moving along a direction parallel to the second opening 112, that is, the shielding member 20 pullably moves relative to the body 10, such that a phenomenon of airflow disturbance between the shielding member 20 and the body 10 can be avoided to the maximum extent, thereby ensuring that no dust is raised to ensure the cleanliness of the mask 1 when the mask 1 is taken out.

It should be noted that, the first opening 111 and the second opening 112 are both located on a circumferential side of the body 10, but the first opening 111 and the second opening 112 are in different directions, that is, the mask 1 may move along a first direction y relative to the body 10, to be taken out from the accommodation space 11, but the shielding member 20 may move along a second direction x relative to the body 10, to be taken out from the accommodation space 11. The first direction y is perpendicular to the first opening 111, the second direction x is perpendicular to the second opening 112, and the first direction y may be perpendicular to the second direction x, or an included angle between the first direction y and the second direction x may not be equal to 90 degrees. This is not limited herein.

Further, areas of cross sections of the accommodation space 11 may all be consistent, that is, an area of a cross section of a first chamber that is of the accommodation space 11 and that is used to accommodate the shielding member 20 may be equal to an area of a cross section of a second chamber that is of the accommodation space 11 and that is used to accommodate the mask 1. Alternatively, an area of a cross section of a first chamber that is of the accommodation space 11 and that is used to accommodate the shielding member 20 may be greater than an area of a cross section of a second chamber that is of the accommodation space 11 and that is used to accommodate the mask 1, to facilitate entering of the mask 1 from the second chamber into the first chamber. An internal structure of the accommodation space 11 is not limited, provided that accommodation of the mask 1 and the shielding member 20 can be ensured. In addition, the first chamber that is of the accommodation space 11 and that is used to accommodate the shielding member 20 is provided with a clamping slot 101 clamped with the clamping portion 22.

In an embodiment, as shown in FIG. 1 and FIG. 4, the body 10 is a rectangle. The body 10 includes two opposite first surfaces 13, two opposite second surfaces 14, and two opposite third surfaces 15. The second surface 14 and the third surface 15 are provided around the first surface 13. The first opening 111 and the second opening 112 are respectively located on the second surface 14 and the third surface 15 that are adjacent to each other. In this case, the first opening 111 and the second opening 112 are in a mutually perpendicular relationship, that is, a move direction of the mask 1 detached from the body 10 and a move direction of the shielding member 20 detached from the body 10 are perpendicular to each other.

Optionally, a height H1 of the first opening 111 is less than a height H2 of the second opening 112, where when the clamping portion 22 is located at the first position, along a height direction of the second opening 112 (that is, direction z), a size H3 of the clamping portion 22 is greater than the height H1 of the first opening 111, or when the clamping portion 22 is located at the second position, along a height direction of the second opening 112 (that is, direction z), a size H4 of the clamping portion 22 is less than the height H1 of the first opening 111.

Figure 5:
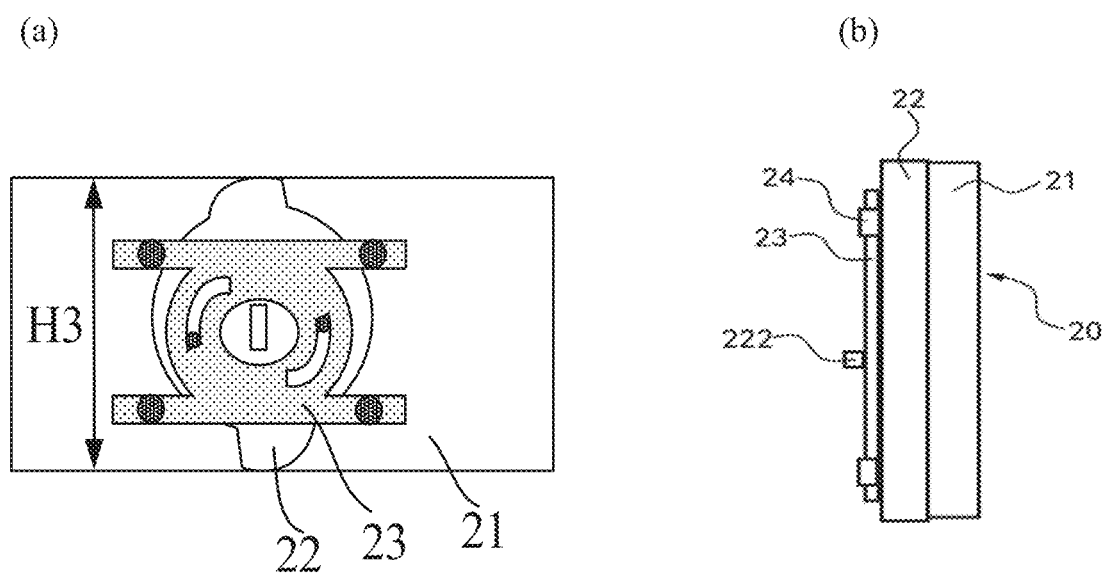
FIG. 5 is a schematic structural diagram showing a case in which a clamping portion of a shielding member of a mask pod is located at a first position according to an exemplary implementation, wherein (a) shows a front view of the shielding member and (b) shows a side view of the shielding member.

With reference to the FIG. 2 and FIG. 5, when the clamping portion 22 is located at the first position, the clamping portion 22 needs to be clamped with the clamping slot 101 of the body 10. In this case, the shielding member 20 is connected to the body 10.

Therefore, the size of the shielding member 20 (that is, size H3 of the clamping portion 22) along the height direction of the second opening 112 (that is, direction z) needs to be greater than the height H1 of the first opening 111, to ensure that the shielding member 20 is not detached from the second opening 112. In this case, the size H3 of the clamping portion 22 along the height direction of the second opening 112 (that is, direction z) is also greater than the size of the cover body portion 21 along the height direction of the second opening 112 (that is, direction z).

Figure 6:
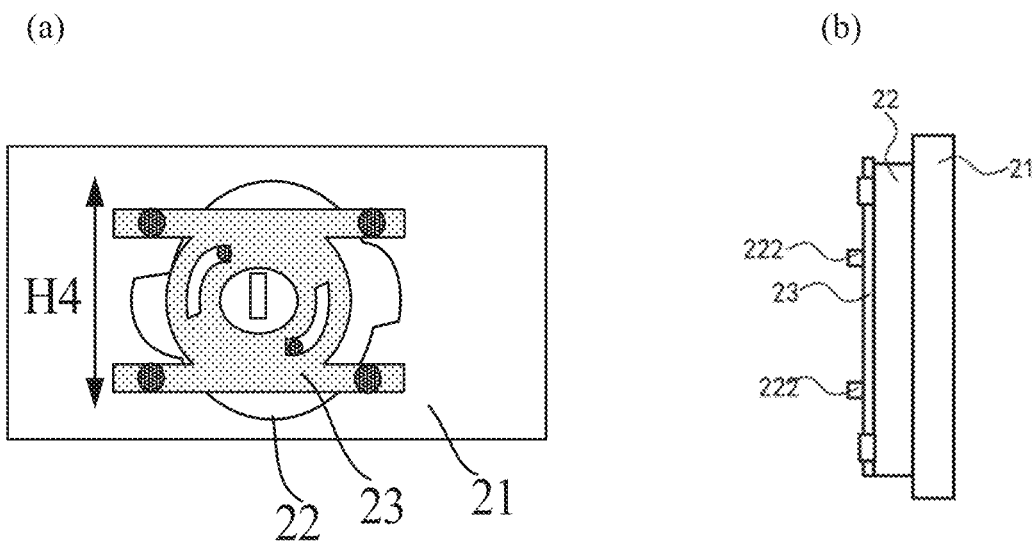
FIG. 6 is a schematic structural diagram showing a case in which a clamping portion of a shielding member of a mask pod is located at a second position according to an exemplary implementation, wherein (a) shows a front view of the shielding member and (b) shows a side view of the shielding member.

As shown in FIG. 6, when the clamping portion 22 is located at the second position, the clamping portion 22 needs to be detached from the clamping slot 101 of the body 10. In this case, the shielding member 20 is separated from the body 10. Therefore, the size of the shielding member 20 (that is, size H4 of the clamping portion 22) along the height direction of the second opening 112 (that is, direction z) needs to be less than the height H1 of the first opening 111, to ensure that the shielding member 20 can be detached from the second opening 112. In this case, the size H4 of the clamping portion 22 along the height direction of the second opening 112 (that is, direction z) is not greater than the size of the cover body portion 21 along the height direction of the second opening 112 (that is, direction z). A rotation angle of the clamping portion 22 from the first position to the second position is not limited herein, may be 90 degrees, and may be greater than or less than 90 degrees.

It should be noted that, because at least a part of the shielding member 20 is mounted inside the accommodation space 11 to implement sealing of the mask 1, shielding of the shielding member 20 for the first opening 111 is actually internal shielding, that is, the shielding member 20 is located on a side of the first opening 111 close to the mask 1.

In an embodiment, as shown in FIG. 3 and FIG. 4, a sealing member 30 is provided between the cover body portion 21 and the body 10, to effectively implement sealing of the mask 1, and avoid external contamination of the mask 1. The sealing member 30 may be a sealing member in the related art, for example, a rubber sealing ring structure, which is not limited herein, provided that a case in which the sealing member 30 can seal the cover body portion 21 and the body 10 is embodied as a focal point.

In an embodiment, as shown in FIG. 2 and FIG. 3, the shielding member 20 further includes: a connection portion 23, where the clamping portion 22 is located between the connection portion 23 and the cover body portion 21, and the connection portion 23 is connected to the cover body portion 21. The clamping portion 22 is movably provided relative to the connection portion 23. The connection portion 23 is in corporation with the cover body portion 21, to implement reliable clamping of the clamping portion 22, avoid detaching of the clamping portion 22, and ensure reliable rotation of the clamping portion 22.

The connection portion 23 may be connected to the cover body portion 21 by using a fastener member 24. There may be a plurality of fastener members 24. The fastener member 24 may be a structure such as a bolted joint in the related art, and the fastener member 24 may alternatively be a spring nail in the related art.

Optionally, at least one of the cover body portion 21 and the connection portion 23 is provided with a restrictive slot, and the clamping portion 22 is located inside the restrictive slot, to ensure that the clamping portion 22 can only rotate relative to the cover body portion 21 and the connection portion 23. Alternatively, the clamping portion 22 may be rotatably provided on at least one of the cover body portion 21 and the connection portion 23.

Further, as shown in FIG. 2, when the clamping portion 22 is provided with the rotating slot 221 and the rotating buckle 222, the connection portion 23 is provided with an avoidance hole 231, that is, the avoidance hole 231 implements avoidance of the rotating slot 221 and the rotating buckle 222, to ensure that an external structure can be connected to the clamping portion 22 by using the rotating slot 221, or when the external structure is connected to the rotating buckle 222, the avoidance hole 231 ensures that the rotating buckle 222 does not mutually interfere with the connection portion 23.

An embodiment of the present disclosure further provides a semiconductor device. Referring to FIG. 1 to FIG. 10, the semiconductor device includes the foregoing mask pod 2.

In an embodiment, as shown in FIG. 7 to FIG. 10, the semiconductor device further includes: a load port 40, where the mask pod is provided on the load port 40; and a drive mechanism 50, where the drive mechanism 50 drives the shielding member 20 to move relative to the body 10, such that the shielding member 20 shields or releases the first opening 111, and after the shielding member 20 releases the first opening 111, the drive mechanism 50 takes out the mask 1 through the first opening 111.

Figure 7:
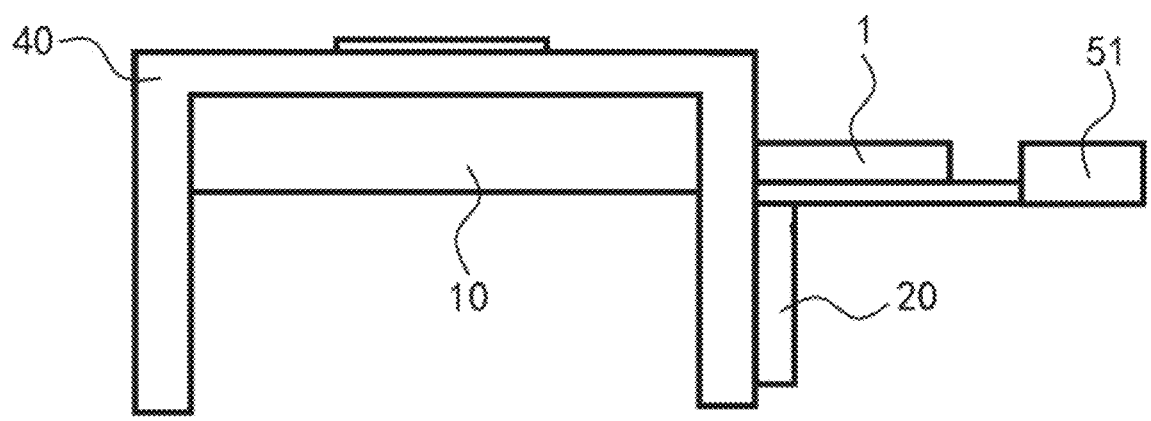
FIG. 7 is a schematic diagram of an application structure of a mask pod shown according to an exemplary embodiment.

Optionally, the load port 40 implements fixing the mask pod 2, to ensure that in a process of using the mask 1, the mask pod 2 is placed on the load port 40 by using a device such as an overhead crane. Then, the shielding member 20 may be opened by using the external structure, and the mask 1 is taken out from the body 10 by using the external structure. In this case, the external structure may be a robot 51. As shown in FIG. 7, in this case, the robot 51 may be a robot structure in the related art. The shielding member 20 is opened by using a machine arm, and the mask 1 is taken out from the body 10. In this case, the drive mechanism 50 may include only the robot 51, and the robot 51 completes a movement that the shielding member 20 releases the first opening 111, and a movement that the mask 1 is taken out from the body 10.

Figure 8:
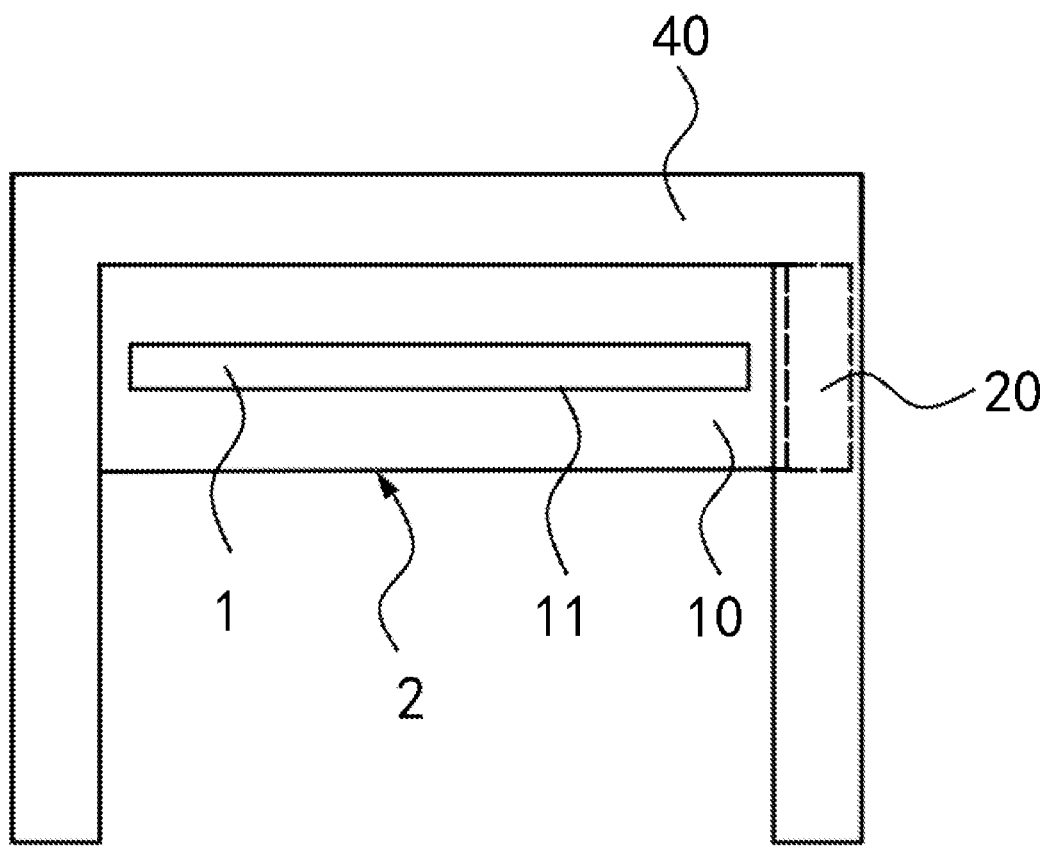
FIG. 8 is a schematic diagram of a combined structure of a mask pod and a load port of a semiconductor device according to an exemplary implementation.

With reference to FIG. 8, the mask pod 2 is placed on the load port 40, the mask 1 is located inside the accommodation space 11, and the shielding member 20 shields the first opening 111, that is, the shielding member 20 is connected to the body 10.

Further, the drive mechanism 50 includes: the robot 51, where the robot 51 drives the clamping portion 22 of the shielding member 20 to switch at the first position and the second position; and an opening and closing member 52, where the opening and closing member 52 drives the shielding member 20 to be pulled out through the second opening 112.

Figure 9:
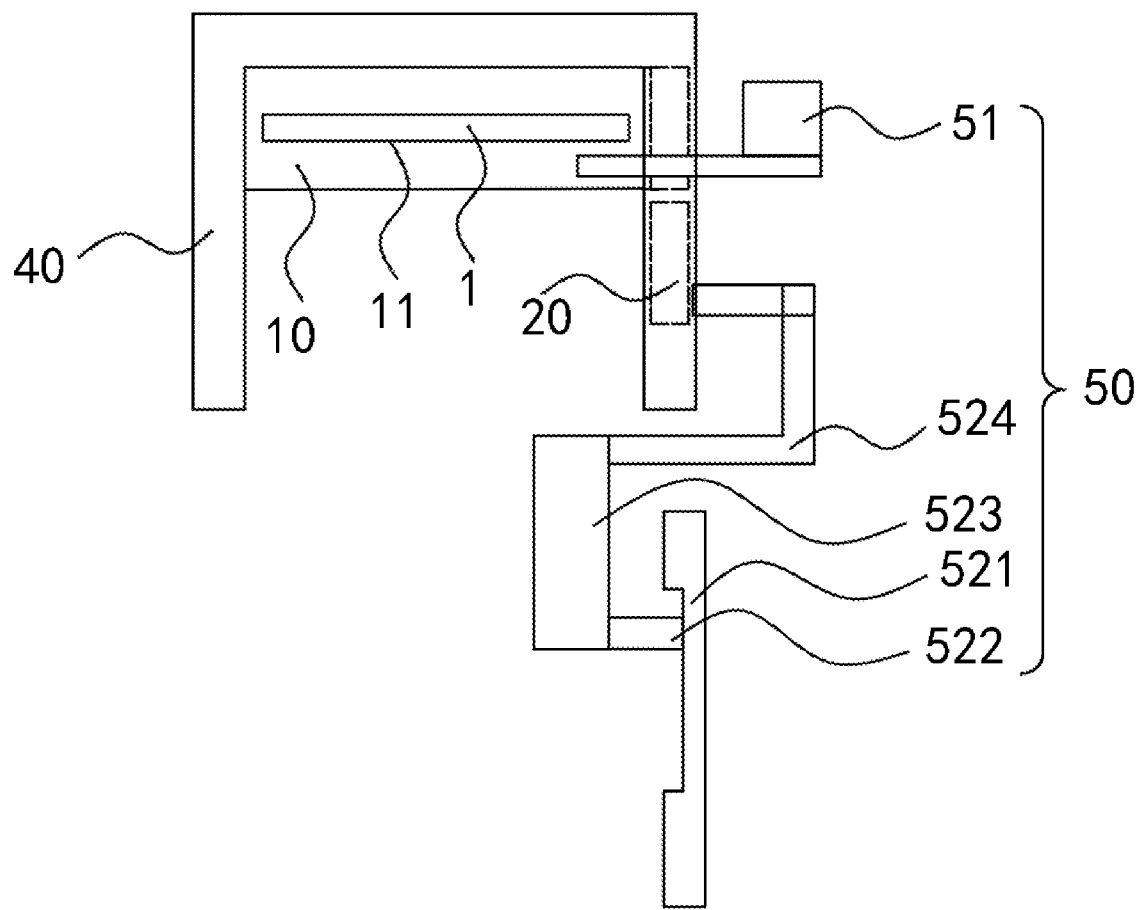
FIG. 9 is a schematic structural diagram of a semiconductor device in a state according to an exemplary implementation.
Figure 10:
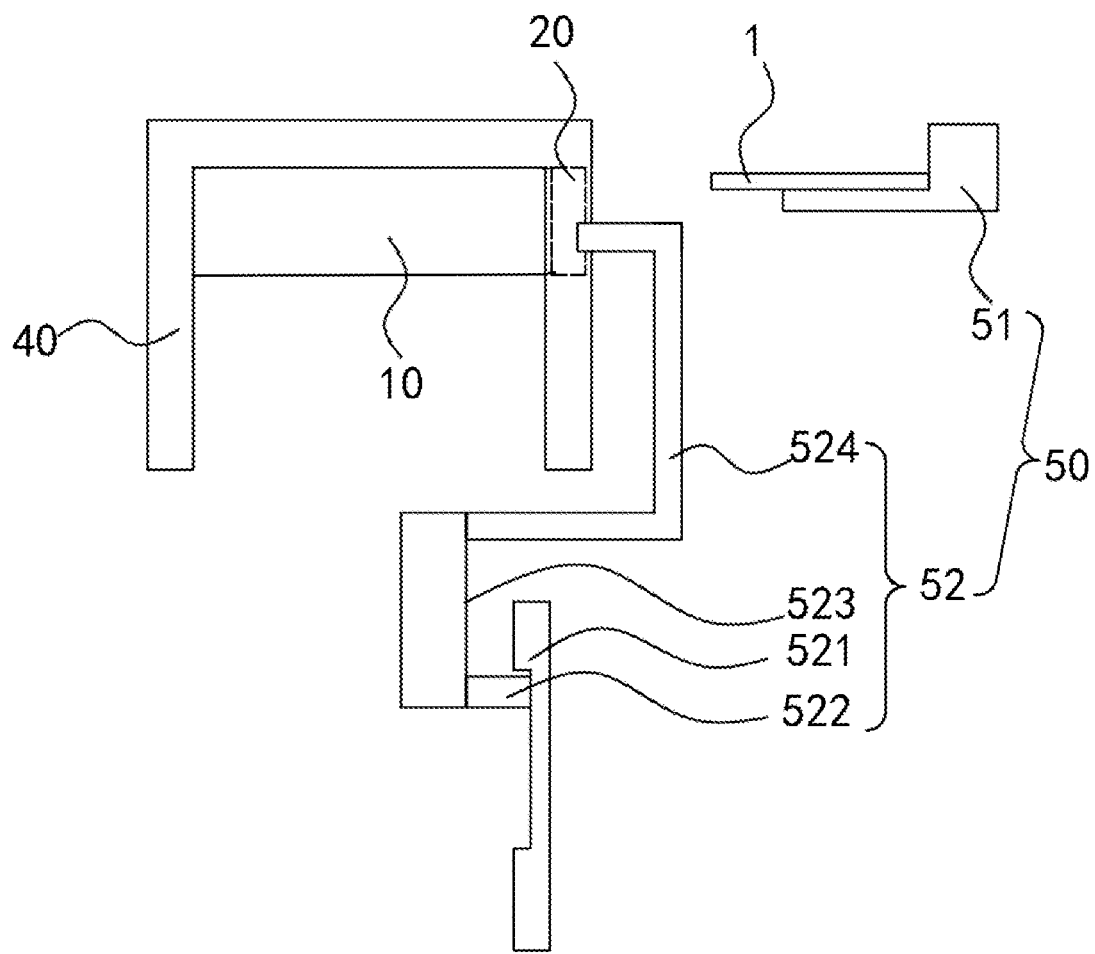
FIG. 10 is a schematic structural diagram of a semiconductor device in another state according to an exemplary implementation.

With reference to FIG. 9, the robot 51 may enable the clamping portion 22 to be separated from the body 10. In this case, the shielding member 20 is separated from the body 10 by using the opening and closing member 52, and the robot 51 may stretch into the accommodation space 11 through the first opening 111, to take out the mask 1. In addition, after the robot 51 takes out the mask 1, the opening and closing member 52 places the shielding member 20 into the body 10 through the second opening 112, as shown in FIG. 10. Finally, the robot 51 may place the mask 1 on a station to be used, and connect the clamping portion 22 to the body 10, to complete an overall procedure of taking out the mask 1. If the mask 1 needs to be placed back into the body 10 after being used, a reverse operation may be performed, to seal the body 10 inside the mask pod 2. Details are not described herein.

Optionally, with reference to the FIG. 9 and FIG. 10, the opening and closing member 52 includes: a sliding track 521; a sliding block 522, where the sliding block 522 is provided on the sliding track 521, and may be movably provided along the sliding track 521; a drive portion 523, where the drive portion 523 is drivingly connected to the sliding block 522, to drive the sliding block 522 to move along the sliding track 521; and an opening and closing portion 524, where the opening and closing portion 524 is provided on the drive portion 523 and is configured to connect to the shielding member 20, to drive the shielding member 20 to move relative to the body 10. After the robot 51 enables the clamping portion 22 to be separated from the body 10, the opening and closing portion 524 is connected to the shielding member 20, such that the drive portion 523 is started, and the drive portion 523, the sliding block 522, and the opening and closing portion 524 move as a whole, thereby enabling the shielding member 20 to move. A move direction of the sliding block 522 is determined by using the sliding track 521. As shown in FIG. 9 and FIG. 10, the sliding track 521 may be provided along a vertical direction.

It should be noted that, after the mask pod 2 is placed on the load port 40, the opening and closing portion 524 may be first connected to the shielding member 20, for example, the opening and closing portion 524 is connected to the cover body portion 21, or the opening and closing portion 524 is connected to the connection portion 23. Certainly, time at which the opening and closing portion 524 is connected to the shielding member 20 is not limited, provided that it is ensured that after the robot 51 enables the clamping portion 22 to be detached from the body 10, the opening and closing member 52 can enable the shielding member 20 to be detached from the body 10, that is, the first opening 111 is released, and enable the robot 51 to take out the mask 1 from the mask pod 2.

Optionally, the opening and closing member 52 may drive the shielding member 20 to be completely detached from the body 10, that is, the opening and closing member 52 enables the shielding member 20 to be completely pulled out from the body 10.

Alternatively, the opening and closing member 52 may drive a part of the shielding member 20 to be detached from the body 10, that is, implement effective releasing of the first opening 111. When a part of the shielding member 20 is not detached from the body 10, an operation is easy to perform when the opening and closing member 52 subsequently drives the shielding member 20 to restore to an original position.

It should be noted that, the drive portion 523 may move as a whole. For example, the drive portion 523 may include a gear and a motor, and when the motor drives the gear to rotate, the gear may move relative to an external rack, to implement an overall movement of the drive portion 523. Forward and reverse rotation of the motor realizes an up and down movement of the shielding member 20. Alternatively, the drive portion 523 may partially move. The drive portion 523 may include an oil cylinder and a piston rod, and two ends of the piston rod may be respectively connected to the sliding block 522 and the opening and closing portion 524, to implement an up and down movement of the shielding member 20 by using the piston rod.

Optionally, the opening and closing member 52 may include the drive portion 523 and the opening and closing portion 524, and the drive portion 523 is connected to the opening and closing portion 524, to drive the opening and closing portion 524 to move up and down. The drive portion 523 may be a drive mechanism such as a telescopic motor, a pneumatic cylinder, or an oil cylinder.

Those skilled in the art may easily figure out other implementations of the present disclosure after considering the specification and practicing the content disclosed herein. The present disclosure is intended to cover any variations, purposes, or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure.

The invention claimed is:

1. A mask pod, comprising:
 a rectangular body having an accommodation space configured to accommodate a mask, the rectangular body comprising two opposite first surfaces, two opposite second surfaces, and two opposite third surfaces; and
 a shielding member, wherein:
  the two opposite second surfaces and the two opposite third surfaces are located at a circumferential side of the rectangular body,
  a first opening and a second opening are respectively located on one of the two opposite second surfaces and one of the two opposite third surfaces that are adjacent to each other,
  the shielding member comprises:
   a cover body portion, wherein the cover body portion shields or releases the first opening; and
   a clamping portion, wherein the clamping portion is connected to the cover body portion and is rotatably provided relative to the cover body portion, such that the clamping portion has a first position clamped with the rectangular body and a second position separated from the rectangular body, and
  the rectangular body is provided with a clamping slot,
  when the clamping portion is located at the first position, the clamping portion is inserted into the clamping slot, and
  when the clamping portion is located at the second position, the clamping portion is detached from the clamping slot and the shielding member is detachably connected to the rectangular body through the second opening to shield or release the first opening.

2. The mask pod according to claim 1, wherein the clamping portion is provided with a rotating slot, and the clamping portion is provided with a rotating buckle.

3. The mask pod according to claim 2, wherein there are a plurality of rotating slots and a plurality of rotating buckles on the clamping portion.

4. The mask pod according to claim 1, wherein a height of the first opening is less than a height of the second opening, and
 when the clamping portion is located at the first position, along a height direction of the second opening, a size of the clamping portion is greater than the height of the first opening, and when the clamping portion is located at the second position, along the height direction of the second opening, the size of the clamping portion is less than the height of the first opening.

5. The mask pod according to claim 1, wherein a rotation angle of the clamping portion from the first position to the second position is 90 degrees.

6. The mask pod according to claim 1, wherein a sealing member is provided between the cover body portion and the rectangular body.

7. The mask pod according to claim 1, wherein the shielding member further comprises:
 a connection portion, wherein the clamping portion is located between the connection portion and the cover body portion, and the connection portion is connected to the cover body portion; and
 the clamping portion is movably provided relative to the connection portion.

8. The mask pod according to claim 7, wherein the connection portion is connected to the cover body portion by using a fastener member.

9. The mask pod according to claim 7, wherein the clamping portion is provided with a rotating slot, the clamping portion is provided with a rotating buckle, and the connection portion is provided with an avoidance hole, wherein the avoidance hole implements avoidance of the rotating slot and the rotating buckle.

10. A semiconductor device, comprising:
 a load port, wherein the mask pod of claim 1 is provided on the load port; and
 a drive mechanism, wherein the drive mechanism drives the shielding member to move relative to the rectangular body; and the drive mechanism comprises:
  a robot, wherein the robot drives the clamping portion of the shielding member to switch between the first position and the second position; and
  an opening and closing member, wherein the opening and closing member drives the shielding member to be pulled out from the second opening.

11. The semiconductor device according to claim 10, wherein the opening and closing member comprises:
 a sliding track;
 a sliding block, wherein the sliding block is provided on the sliding track and is movably provided along the sliding track;
 a drive portion, wherein the drive portion is drivingly connected to the sliding block, to drive the sliding block to move along the sliding track; and
 an opening and closing portion, wherein the opening and closing portion is provided on the drive portion and is configured to connect to the shielding member, to drive the shielding member to move relative to the rectangular body.

\* \* \* \* \*